(12) United States Patent
Ke et al.

(10) Patent No.: US 8,039,284 B2
(45) Date of Patent: Oct. 18, 2011

(54) DUAL METAL SILICIDES FOR LOWERING CONTACT RESISTANCE

(75) Inventors: Chung-Hu Ke, Taipei (TW); Chih-Hsin Ko, Fongshan (TW); Hung-Wei Chen, Hsinchu (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/640,713

(22) Filed: Dec. 18, 2006

(65) Prior Publication Data
US 2008/0145984 A1 Jun. 19, 2008

(51) Int. Cl.
*H01L 21/00* (2006.01)
*H01L 29/84* (2006.01)
(52) U.S. Cl. ............... 438/50; 257/415; 257/369
(58) Field of Classification Search ........... 438/197, 438/199, 50–53; 257/369, 415
See application file for complete search history.

(56) References Cited

U.S. PATENT DOCUMENTS

| | | | | |
|---|---|---|---|---|
| 6,015,752 A * | 1/2000 | Xiang et al. | ........ | 438/655 |
| 6,369,429 B1 * | 4/2002 | Pramanick et al. | ........ | 257/382 |
| 6,905,622 B2 | 6/2005 | Padhi et al. | | |
| 6,969,678 B1 | 11/2005 | Chiu et al. | | |
| 6,974,737 B2 | 12/2005 | Snyder et al. | | |
| 7,053,400 B2 * | 5/2006 | Sun et al. | ........ | 257/19 |
| 7,112,483 B2 | 9/2006 | Lin et al. | | |
| 7,589,385 B2 * | 9/2009 | Lin et al. | ........ | 257/369 |
| 2003/0235936 A1 * | 12/2003 | Snyder et al. | ........ | 438/92 |
| 2005/0042831 A1 | 2/2005 | Mehrotra | | |
| 2005/0186722 A1 * | 8/2005 | Cheng et al. | ........ | 438/199 |
| 2005/0287730 A1 | 12/2005 | Snyder et al. | | |
| 2006/0017110 A1 * | 1/2006 | Adetutu et al. | ........ | 257/365 |
| 2006/0163670 A1 * | 7/2006 | Ellis-Monaghan et al. | .. | 257/388 |
| 2007/0001233 A1 * | 1/2007 | Schwan et al. | ........ | 257/369 |
| 2007/0264783 A1 * | 11/2007 | Chen et al. | ........ | 438/275 |

OTHER PUBLICATIONS

Itabashi, T., et al., "Electroless Deposited CoWB for Copper Diffusion Barrier Metal," 2002 IITC, pp. 285-287, IEEE.
Kedzierski, J., et al., "Complementary Silicide Source/Drain Thin-Body MOSFETs for the 20nm Gate Length Regime," 2000 IEDM, 4 pp., IEEE.
Ozturk, M. C., et al., "Low Resistivity Nickel Germanosilicide Contacts to Ultra-Shallow $Si_{1-x}Ge_x$ Source/Drain Junctions for Nanoscale CMOS," 2003 IEDM, 4 pp., IEEE.

(Continued)

*Primary Examiner* — Calvin Lee
(74) *Attorney, Agent, or Firm* — Slater & Matsil, L.L.P.

(57) ABSTRACT

A method for forming a semiconductor structure includes: providing a semiconductor substrate; forming an NMOS device at a surface of the semiconductor substrate, which comprises forming a first source/drain electrode on a first source/drain region of the NMOS device, wherein the first source/drain electrode has a first barrier height; forming a PMOS device at the surface of the semiconductor substrate comprising forming a second source/drain electrode on a second source/drain region of the PMOS device, wherein the second source/drain electrode has a second barrier height, and wherein the first barrier height is different from the second barrier height; forming a first stressed film having a first intrinsic stress over the NMOS device; and forming a second stressed film having a second intrinsic stress over the PMOS device, wherein the first intrinsic stress is more tensile than the second intrinsic stress.

6 Claims, 6 Drawing Sheets

OTHER PUBLICATIONS

Taylor, W. J., et al., "Materials Challenges for CMOS Junctions," 2004 Mat. Res. Symp. Proc., vol. 810, pp. 3-14, Materials Research Society.

Yang, H. S., et al., "Dual Stress Liner for High Performance sub-45nm Gate Length SOI CMOS Manufacturing," 2004 IEDM, 3 pp., IEEE.

* cited by examiner

DUAL METAL SILICIDES FOR LOWERING CONTACT RESISTANCE

TECHNICAL FIELD

This invention relates generally to semiconductor devices, and more particularly to structures and manufacturing methods of metal-oxide-semiconductor (MOS) devices.

BACKGROUND

The scaling of VLSI circuits is a constant effort. Smaller integrated circuits allow more devices to be formed in one semiconductor chip. Additionally, power consumption and performance are also improved. With circuits becoming smaller and faster, improvement in the device driving current is becoming more important, which can be increased by improving carrier mobility. Among efforts made to enhance carrier mobility, forming a stressed channel region is a known practice. The performance of a MOS device can be enhanced through a stressed-surface channel. This technique allows performance to be improved at a constant gate length without adding complexity to the circuit fabrication or design.

Research has revealed that a bi-axial in-plane tensile stress field can improve NMOS performance, and a compressive stress parallel to the channel length direction can improve PMOS device performance. A commonly used method for applying stress to the channel region is forming a stressed contact etch stop layer (CESL) on a MOS device. The stressed CESLs introduce stress into the channel region. Therefore, the carrier mobility is improved. Typically, thick CESLs are preferred since thicker CESLs apply greater stresses in the channel regions of MOS devices. Another commonly used method is forming stressors in source/drain regions. The stressors typically have lattice constants different from that of the semiconductor substrate in which the MOS devices are formed.

The scaling of integrated circuits, however, encounters a problem with such a method. FIG. 1 illustrates a modeling of the resistances in a MOS device. The resistances include four portions, a contact resistance $R_{co}$, an extension resistance $R_{extension}$, an overlap resistance $R_{ol}$, and a channel region $R_{channel}$. FIG. 2 illustrates a trend reflecting the weight of an external resistance $R_{ext}$, which equals ($R_{co}+R_{extension}+R_{ol}$), with respect to the channel resistance $R_{channel}$ as a function of the technology nodes. It is found that for 130 nm technology or greater, external resistance $R_{ext}$ is small compared to the channel resistance $R_{channel}$. With the scaling of integrated circuits, $R_{ext}$ becomes increasingly greater with respect to the channel resistance $R_{channel}$. Since the device drive current is inversely proportional to the total resistance ($2R_{ext}+R_{channel}$), the increase in drive current is at least partially offset by the increase in external resistance $R_{ext}$. When technologies evolve to 65 nm and beyond, the benefit of stressing channels to increase device drive currents is so small that the benefit will no longer be worth the process complexity introduced for generating stresses. It is also expected that in 45 nm technology and below, extension resistance $R_{extension}$ will far exceed channel resistance $R_{channel}$. Beyond 45 nm technology, $R_{ext}$ becomes the bottleneck for further improvement of device performance. Since contact resistance $R_{co}$ plays an important role in $R_{ext}$, it must be reduced in order to continue improving the device performance, especially when the gain comes from strained silicon. A semiconductor device that may overcome the previously discussed deficiencies of the prior art is thus needed.

SUMMARY OF THE INVENTION

In accordance with one aspect of the present invention, a semiconductor structure includes a semiconductor substrate, an NMOS device, and a PMOS device on a surface of the semiconductor substrate. The NMOS device includes a first source/drain electrode on a source/drain region of the NMOS device, wherein the first source/drain electrode has a first barrier height, and a first stressed film having a first intrinsic stress over the NMOS device. The PMOS device includes a second source/drain electrode on a source/drain region of the PMOS device, wherein the second source/drain electrode has a second barrier height, and a second stressed film having a second intrinsic stress over the PMOS device. The first intrinsic stress is preferably more tensile than the second intrinsic stress. The first barrier height is preferably different from the second barrier height.

In accordance with another aspect of the present invention, a semiconductor structure includes: a semiconductor substrate; an NMOS device comprising a first source/drain electrode over a first portion of the semiconductor substrate, wherein the first portion has a first lattice constant, and wherein the first source/drain electrode comprises a first metal; and a PMOS device comprising a second source/drain electrode over a second portion of the semiconductor substrate, wherein the second portion has a second lattice constant greater than the first lattice constant, and wherein the second source/drain electrode comprises a second metal different from the first metal. The semiconductor structure further includes a stressed film over the NMOS device and the PMOS device.

In accordance with yet another aspect of the present invention, a method for forming a semiconductor structure includes: providing a semiconductor substrate; forming an NMOS device at a surface of the semiconductor substrate, which comprises forming a first source/drain electrode on a first source/drain region of the NMOS device, wherein the first source/drain electrode has a first barrier height; and forming a PMOS device, which comprises forming a second source/drain electrode on a second source/drain region of the PMOS device, wherein the second source/drain electrode has a second barrier height, and wherein the first barrier height is different from the second barrier height. The method further includes forming a first stressed film having a first intrinsic stress over the NMOS device, and forming a second stressed film having a second intrinsic stress over the PMOS device. The first intrinsic stress is more tensile than the second intrinsic stress.

In accordance with yet another aspect of the present invention, a method for forming a semiconductor structure includes: providing a semiconductor substrate; forming a first source/drain region of a first MOS device, wherein the first source/drain region has at least a portion in the semiconductor substrate; forming a second source/drain region of a second MOS device, wherein the second source/drain region has at least a portion in the semiconductor substrate; and wherein the second MOS device is of an opposite conductivity type than the first MOS device. The method further includes: masking the second MOS device; forming a first source/drain electrode having a first barrier height on the first source/drain region; masking the first MOS device; forming a second source/drain electrode having a second barrier height on the second source/drain region, wherein the first barrier height is different from the second barrier height; forming a first stressed film having a first intrinsic stress over the first MOS device; and forming a second stressed film having a second intrinsic stress over the second MOS device, wherein the first intrinsic stress is more tensile than the second intrinsic stress.

The advantageous feature of the present invention includes reduced contact resistance in MOS devices. The improvements in device drive currents resulting from the stressed channel regions are thus significant enough to justify the process complexity introduced by forming stressed channel regions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

To continue the trend of improving the device drive current with stressed channels, the external resistance $R_{ext}$ needs to be reduced. It has been found that the greatest portion of the external resistance $R_{ext}$ is the contact resistance between the source/drain electrodes and the underlying source/drain regions. As used herein, source/drain represents either source or drain or both. With the scaling of integrated circuits, the contact resistance will become an increasingly greater portion of the external resistance. The contact resistance is exponentially proportional to a barrier height $\Phi$ between the source/drain electrodes and the underlying semiconductor substrate. Therefore, reducing barrier height $\Phi$ will exponentially reduce the contact resistance. The preferred embodiments of the present invention are thus provided to address such reasoning.

Figure 1:
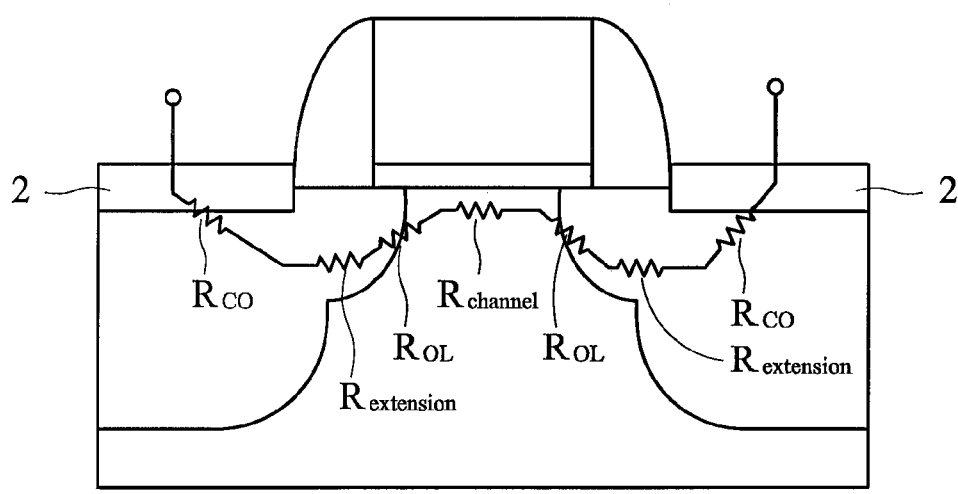
FIG. 1 illustrates a modeling of the resistances in a MOS device.
Figure 2:
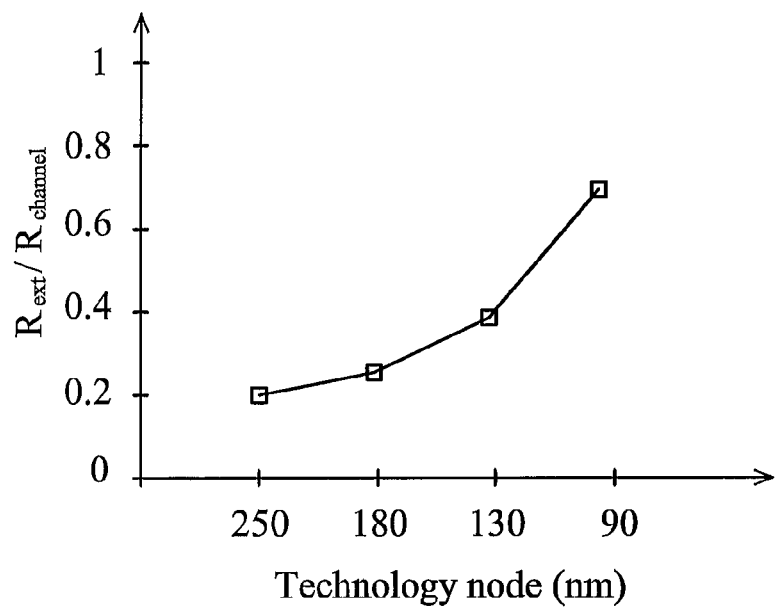
FIG. 2 illustrates ratios of an external resistance with respect to a channel resistance as a function of technology nodes.
Figure 3:
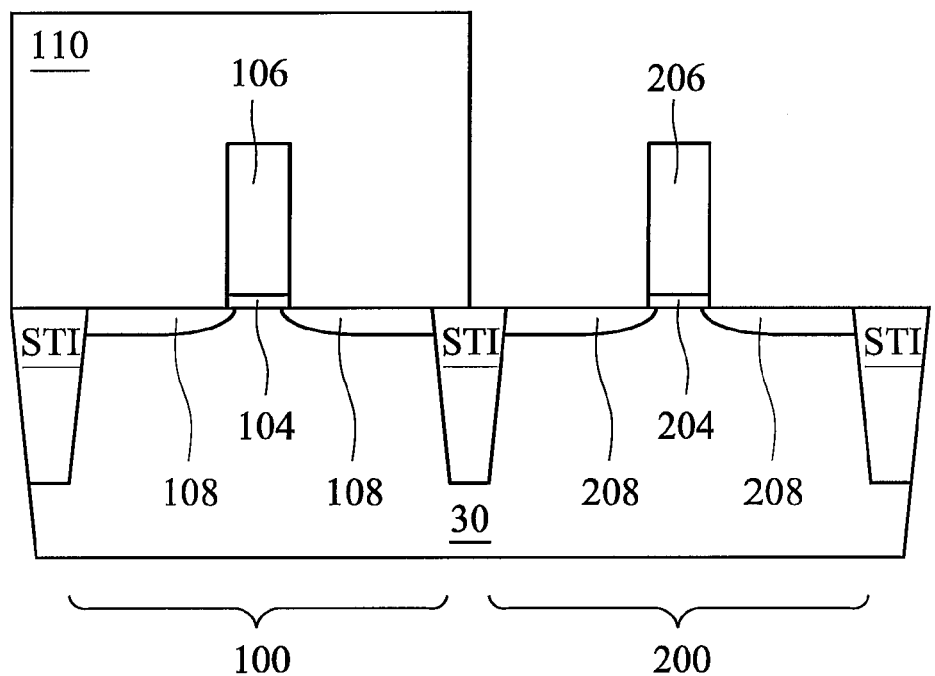
FIGS. 3 through 10 illustrate cross-sectional views of intermediate stages in the manufacture of a preferred MOS embodiment.

FIG. 3 illustrates a substrate 30 comprising two regions, a region 100 for forming an NMOS device and a region 200 for forming a PMOS device. Shallow trench isolation (STI) regions are formed in substrate 30 to isolate device regions 100 and 200. Substrate 30 is preferably a bulk silicon substrate, but other commonly used materials and structures such as SiGe, silicon on insulator (SOI), SiGe on insulator, and strained silicon on insulator can also be used. A gate stack, including a gate dielectric 104 and a gate electrode 106, is formed in NMOS region 100. Similarly, a gate stack, including a gate dielectric 204 and a gate electrode 206, is formed in PMOS region 200.

Lightly doped drain/source (LDD) regions 108 and 208 are then formed. Preferably, a photo resist 110 is formed and patterned to mask NMOS region 100. PMOS region 200 is then implanted with a p-type impurity such as boron, and LDD regions 208 are formed. Photo resist 110 is then removed. Similarly, NMOS region 100 may be implanted with an n-type impurity, forming LDD regions 108. During the n-type impurity implantation, PMOS region 200 is masked by a photo resist (not shown).

Figure 4:
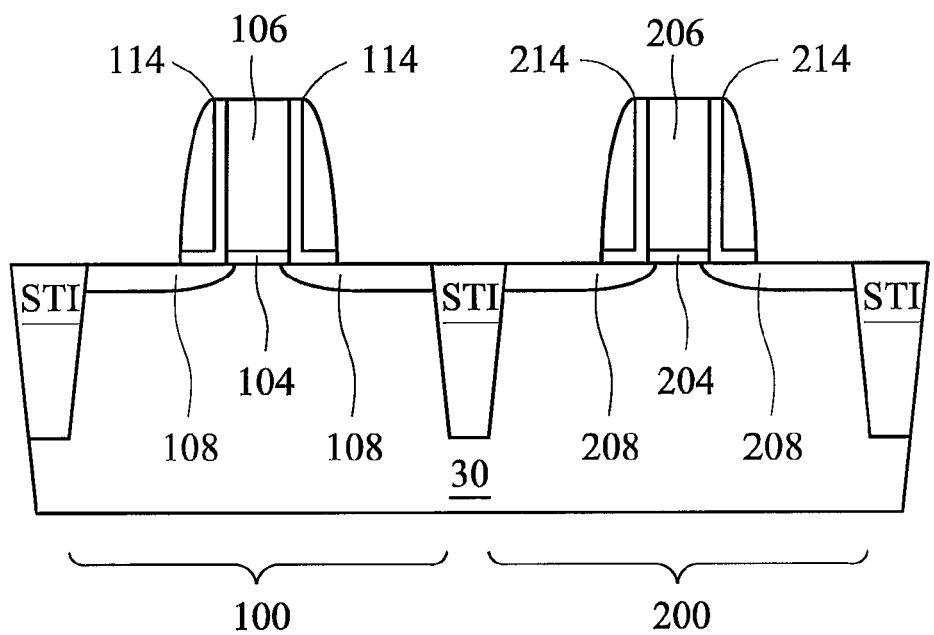

FIG. 4 illustrates the formation of spacers 114 and 214 in regions 100 and 200, respectively. As is known in the art, the formation of spacers preferably includes forming one or more dielectric layer(s) and etching the dielectric layer(s). The remaining portion of the dielectric layer(s) becomes spacers. The formation of the dielectric layer(s) includes commonly used techniques, such as plasma enhanced chemical vapor deposition (PECVD), low-pressure chemical vapor deposition (LPCVD), sub-atmospheric chemical vapor deposition (SACVD), and the like. Spacers 114 and 214 may comprise a single layer or more than one layer, such as a silicon nitride layer on a silicon oxide layer.

Figure 5A:
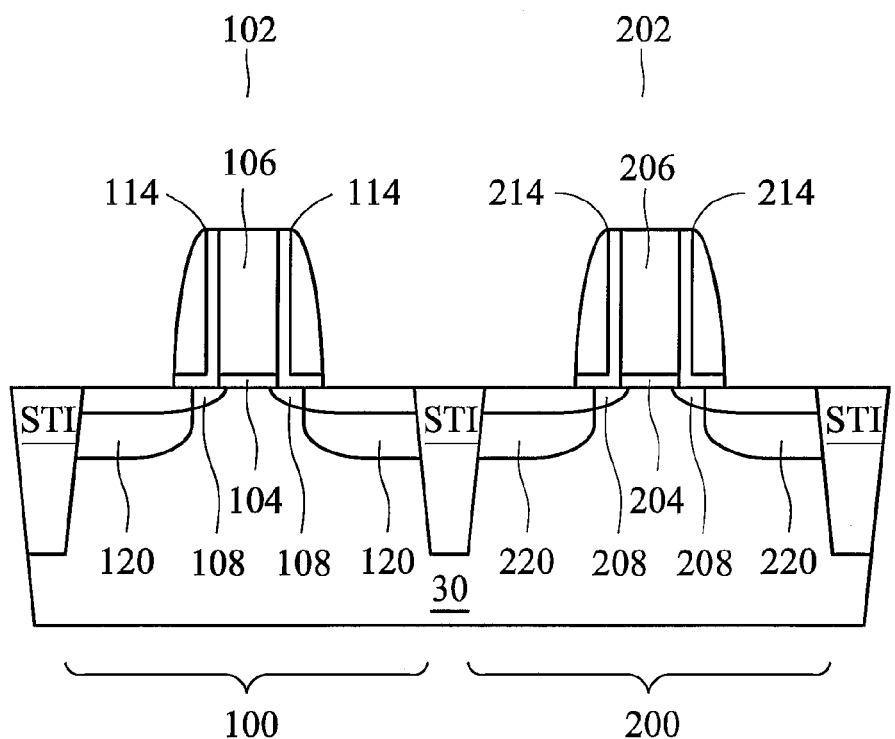

FIG. 5A illustrates the formation of the source/drain regions 120 and 220. As is known in the art, source/drain regions 120 and 220 may be recessed in or elevated above substrate 30 (using, e.g., epitaxially grown regions). In the preferred embodiment, source/drain regions 120 and 220 are formed by implanting impurities into semiconductor substrate 30. Gate electrodes 106 and 206 are preferably implanted simultaneously with the respective source/drain regions to reduce sheet resistance. When region 100 is implanted with an n-type impurity, region 200 is masked by a photo resist (not shown). Similarly, when region 200 is implanted with a p-type impurity, region 100 is masked by a photo resist (not shown). The resulting NMOS device and PMOS device are denoted as NMOS device 102 and PMOS device 202, respectively.

Implantation may also be performed to introduce stress to channel regions. Preferably, atoms of a material with a native lattice constant greater than that of silicon, for example, germanium, are preferably implanted into source/drain regions 220 to introduce compressive stress to the channel region of PMOS device 202. Atoms of a material with a native lattice constant smaller than that of silicon, for example, carbon, are preferably implanted into source/drain region 120 to introduce tensile stress to the channel region of NMOS device 102.

Figure 5B:
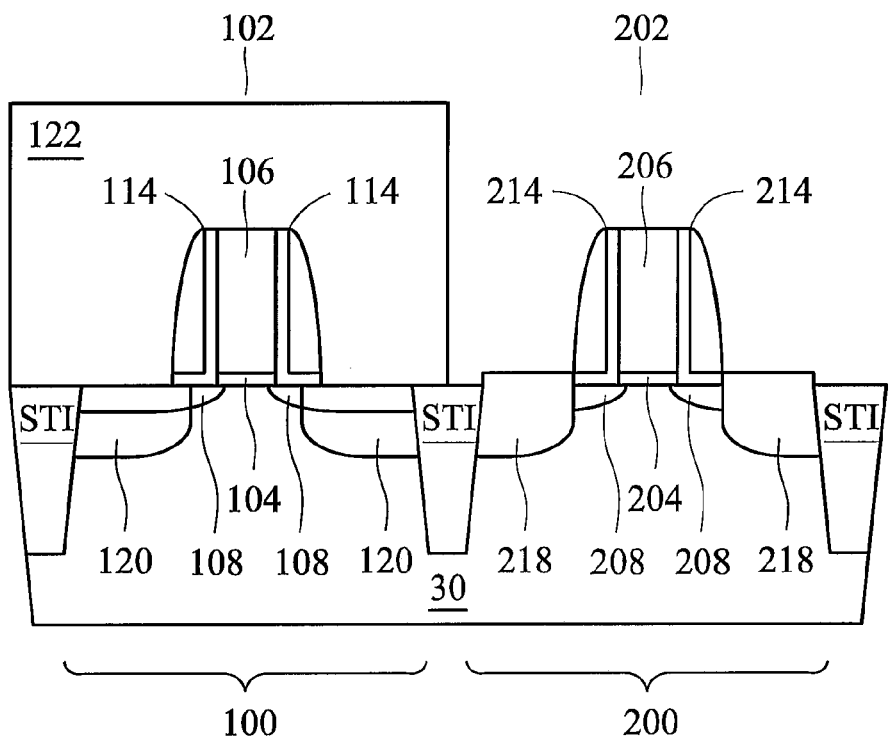

In alternative embodiments, as is shown in FIG. 5B, SiGe stressors 218 are formed in PMOS regions 200. Preferably, a photo resist 122 is formed covering NMOS region 100. Recesses are formed in substrate 30 along the outside edges of the spacers 214, preferably by etching. SiGe stressors 218 are then formed in the recesses. In the preferred embodiment, SiGe stressors 218 are epitaxially grown. P-type impurities, such as boron, may be doped either during or after the epitaxial growth. The photo resist 122 is then removed. Stressors 218 introduce a compressive stress to the respective channel region of the resulting PMOS device 202, and the drive current of the respective PMOS device 202 is increased. SiC stressors (not shown) may also be formed in source/drain regions 120 for NMOS device 102 using similar methods.

Figure 6:
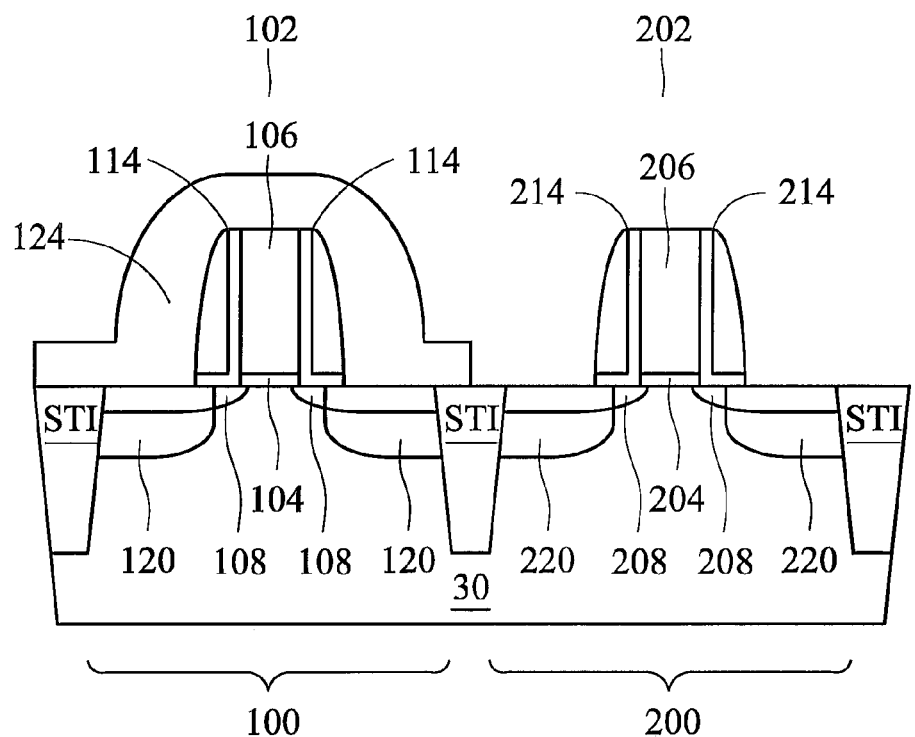

FIG. 6 illustrates the formation of a mask layer 124 covering NMOS region 100. In the preferred embodiment, mask layer 124 is a blanket resist protective oxide (RPO) layer. The portion of the mask layer 124 over PMOS region 200 is removed. Exemplary RPO materials include silicon oxide, silicon nitride, and combinations thereof. The removal process of the mask layer 124 includes wet etching and dry etching. Mask layer 124 preferably has an inherent tensile stress.

Figure 7:
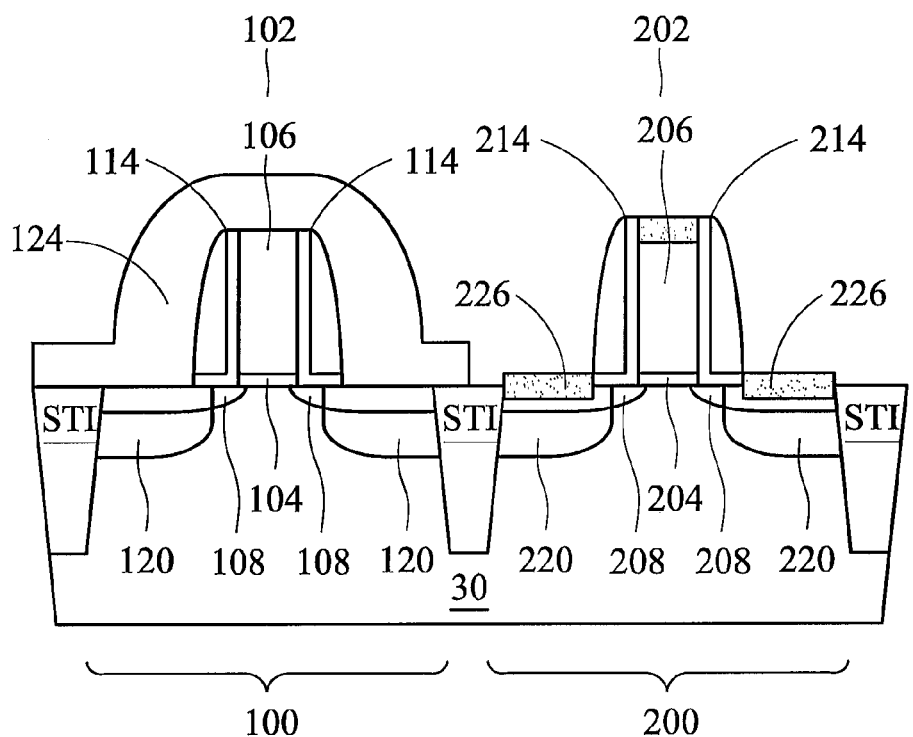

Referring to FIG. 7, source/drain electrodes 226 are formed on source/drain regions 220. In a first embodiment for forming source/drain electrodes 226, a metal layer is blanket deposited. The metal layer preferably includes metals that will have a low barrier height with the underlying semiconductor material, such as platinum, manganese, palladium, cobalt, nickel, tantalum, ruthenium, tungsten, and combinations thereof. As a result, contact resistance is reduced. The device is then annealed to form a silicide between the deposited metal layer and the underlying source/drain regions 220. Un-reacted metal is then removed. Gate electrode 206 is preferably silicided simultaneously with source/drain regions 220. It is to be realized that if germanium is present in the source/drain regions, germano-silicide will be formed. Throughout the description, the term "silicide" also includes germano-silicide.

In a second embodiment, a selective electroless plating is performed. Preferably, source/drain electrodes 226 are deposited from an electroless solution containing at least a metal salt and a reducing agent. The electroless solution may further include additives to improve deposition of the metal. Additives may include surfactants, complexing agents, pH adjusting agents, and combinations thereof. Suitable metal salts include chlorides, sulfates, sulfamates, and combinations thereof. Cobalt chloride is an example of a metal salt. Silicon compounds are also preferably added in the electroless solution, for example, in the form of chemicals comprising Si(OH). The metal salt may be in the electroless solution at a concentration between about 0.5 g/L and about 30 g/L, such as between about 2.5 g/L and about 25 g/L. Suitable reducing agents include sodium hypophosphite, hydrazine, formaldehyde, and combinations thereof. Additives include surfactants, such as RE 610, complexing agents including salts of carboxylic acids, for example, sodium citrate and sodium succinate, pH adjusting agents including sodium hydroxide and potassium hydroxide, and combinations thereof. The additives can be used to control deposition properties of the electroless solution. For example, stabilizers prevent unwanted side reactions while complexing agents may limit available ions in the electroless solution. Additives have a concentration between about 0.01 g/L and about 50 g/L of the electroless solution, such as between about 0.05 g/L and about 4 g/L of the electroless solution.

Forming the metal layer includes applying the metal electroless solutions described herein to the previously formed structure for between about 30 seconds and about 180 seconds, at a temperature between about 60° C. and about 90° C. The optimum time and temperature may be found through routine experiments.

In the preferred embodiment, source/drain electrodes 226 comprise metal silicides having a low barrier height with the underlying semiconductor material. The respective metals preferably include platinum, manganese, palladium, cobalt, nickel, tantalum, ruthenium, tungsten, and combinations thereof. As a result, contact resistances between electrodes 226 and the underlying semiconductor material are reduced. Alternatively, source/drain electrodes 226 are substantially pure metal electrodes, and thus the respective contacts to the underlying source/drain regions 220 are Schottky contacts.

Figure 8:
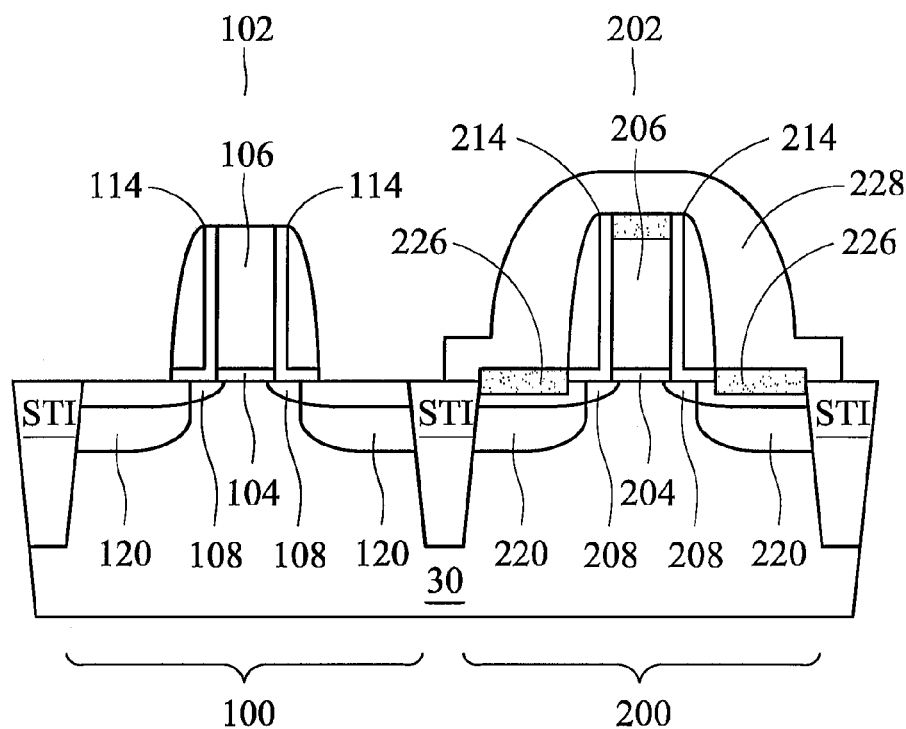

Referring to FIG. 8, mask layer 124 is removed. A contact etch stop layer (CESL) 228 is formed in region 200. CESL 228 preferably has a compressive stress, which can be formed by forming a stressed layer directly, or introducing stress into CESL 228 after its formation. Alternatively, CESL 228 may have a tensile stress, however, with a smaller magnitude than the tensile stress applied on NMOS device 102. Preferably, CESL 228 is blanket deposited, and a portion over NMOS region 100 is etched. The preferred materials of CESL 228 include, but are not limited to, silicon nitride, silicon oxide, silicon oxynitride, silicon carbide, and combinations thereof.

Figure 9:
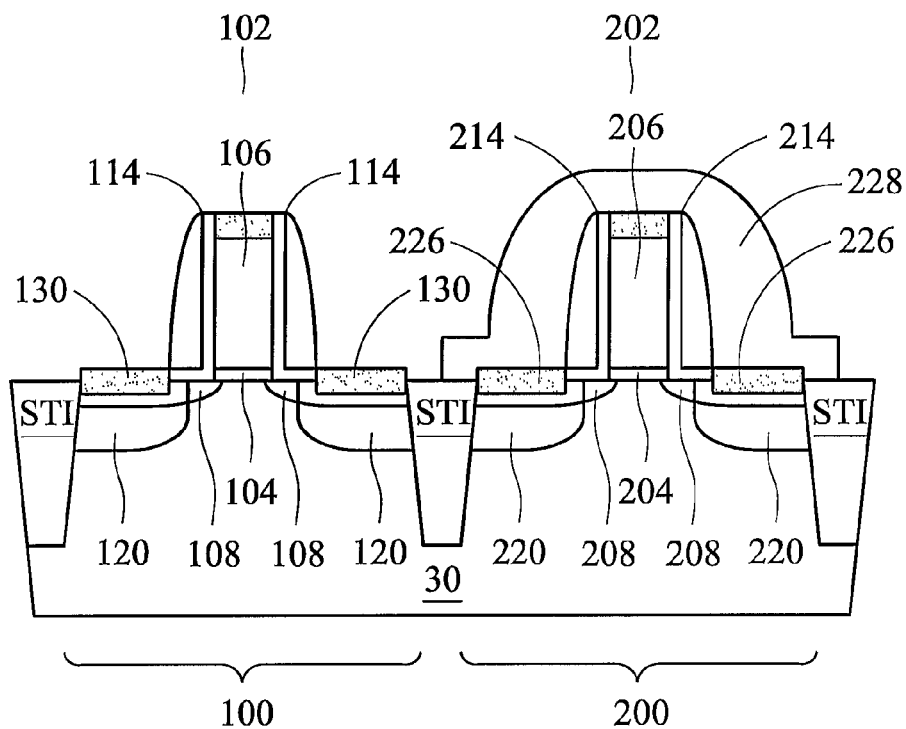

FIG. 9 illustrates the formation of source/drain electrode regions 130, which may be formed using essentially the same methods as used for forming source/drain electrodes 226. Preferably, selective electroless plating is performed. Source/drain electrodes 130 preferably comprise one or more high band-level or mid-gap metals, such as erbium, holmium, titanium, hafnium, zirconium, ytternium, cobalt, nickel, and the like. Source/drain electrodes 130 are preferably silicide regions. Alternatively, they comprise substantially pure metal, and thus the resulting contacts are Schottky contacts. Preferably, if at least one of the source/drain electrodes 130 and 226 are formed using electroless plating, an annealing is performed to form bonds between silicon and metal atoms.

As a general preference, the selection of the metals in source/drain electrodes 130 and 226 is determined as follows. Assuming an NMOS barrier height $\Phi_{bn}$ is defined as the Schottky barrier height between a pure metal source/drain electrode and silicon doped with an n-type impurity, then the metals used in source/drain electrodes 130 are preferably selected so that NMOS barrier height $\Phi_{bn}$ is less than about 0.4 eV. Assuming a PMOS barrier height $\Phi_{bp}$ is defined as the Schottky barrier height between a pure metal source/drain electrode and silicon doped with an n-type impurity, then the metals used in source/drain electrodes 226 are preferably selected so that PMOS barrier height $\Phi_{bp}$ is greater than about 0.7 eV. The difference between barrier heights $\Phi_{bp}$ and $\Phi_{bn}$ is preferably greater than about 0.15 eV.

Figure 10:
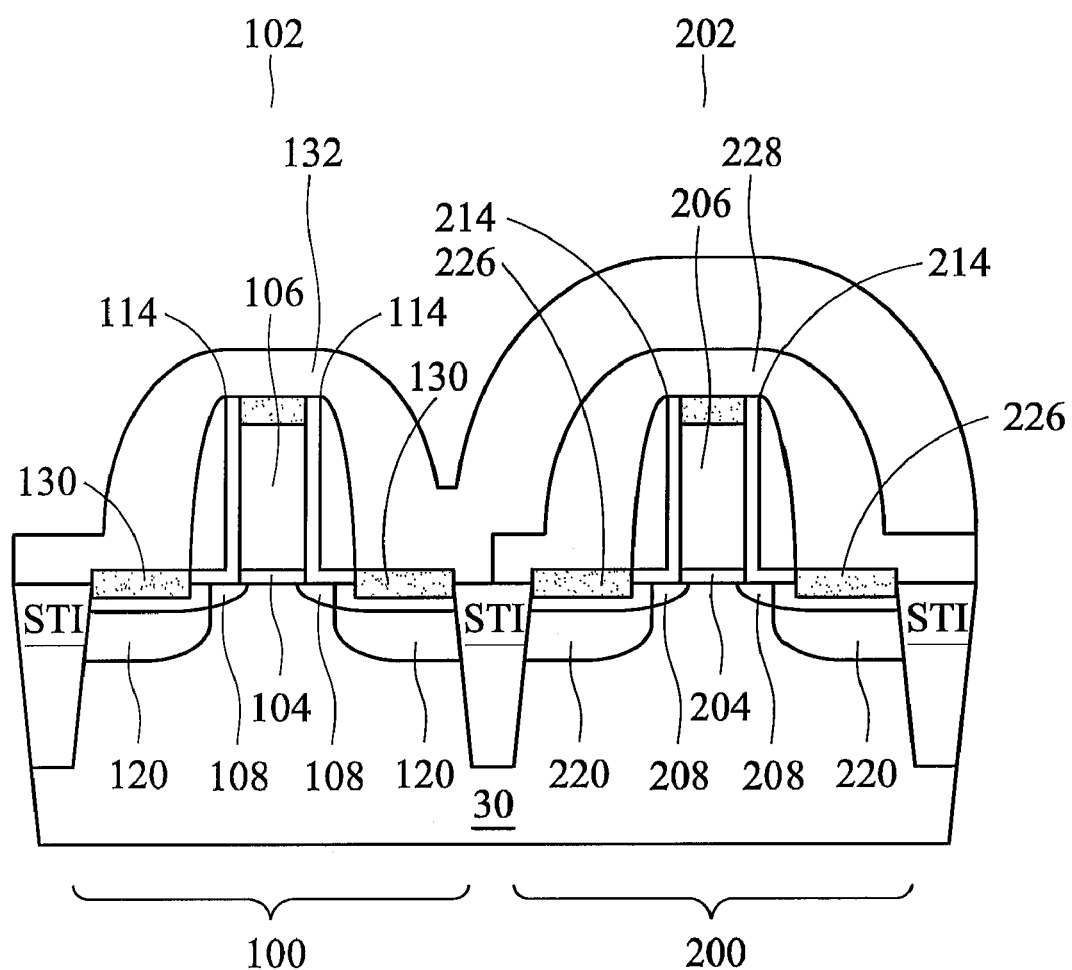

FIG. 10 illustrates the formation of a CESL 132. Preferably, the materials of CESL 132 include commonly used materials such as silicon nitride, silicon oxide, silicon oxynitride, silicon carbide, and combinations thereof. CESL 132 is preferably tensile-stressed to introduce a tensile stress to the channel region of NMOS device 102. Alternatively, CESL 132 may have a compressive stress, however, with a smaller magnitude than the compressive stress applied on PMOS device 202. CESL 132 may include a single layer or a composite layer.

One skilled in the art will realize that in the preferred embodiment, the sequence for forming source/drain electrodes for NMOS device 102 and PMOS device 202 can be reversed. Also, the orders for forming CESLs 132 and 228 can also be reversed.

By differentiating barrier heights of source/drain electrodes of NMOS and PMOS devices, the contact resistances between the source/drain electrodes and the underlying source/drain regions are reduced. This results in the improvement of device drive current. The effects of forming stressed channel regions thus become more significant in small-scale integrated circuits. As a result, MOS devices with gate lengths of less then 65 nm may still have good performance.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor substrate;
   forming a first source/drain region of an NMOS device, wherein the first source/drain region has at least a portion in the semiconductor substrate;
   forming a second source/drain region of a PMOS device, wherein the second source/drain region has at least a portion in the semiconductor substrate, and wherein at least one of the first source/drain region and the second source/drain region has an internal stress material;
   masking the PMOS device by forming a first stressed film having a first intrinsic stress over the PMOS device;
   forming a first source/drain electrode on the first source/drain region while the first stressed film is over the PMOS device, the first source/drain electrode having a first barrier height less than about 0.4eV, wherein the forming the first source/drain electrode comprises using a selective electroless plating process;
   masking the NMOS device;
   forming a second source/drain electrode having a second barrier height greater than about 0.7eV on the second source/drain region using an additional electroless plating process; and
   forming a second stressed film having a second intrinsic stress over the NMOS device and over and adjoining the first stressed film, wherein the second intrinsic stress is more tensile than the first intrinsic stress.

2. The method of claim 1, wherein gate lengths of the NMOS and PMOS devices are less than about 65 nm.

3. The method of claim 1, wherein the first source/drain electrode comprises a first metal silicide, and the second source/drain electrode comprises a second metal silicide.

4. A method for forming a semiconductor structure, the method comprising:
   providing a semiconductor substrate;
   forming an PMOS device and a NMOS device in the semiconductor substrate, wherein the PMOS device comprises a first source/drain region, and the NMOS device comprises a second source/drain region;
   forming a first stressed layer over the NMOS device, the first stressed layer comprising an intrinsic tensile stress;
   forming a first source/drain electrode on the first source/drain region while the first stressed layer remains over the NMOS device;
   forming a second stressed layer over the PMOS device, the second stressed layer comprising an intrinsic compressive stress;
   forming a second source/drain electrode on the second source/drain region while the second stressed layer remains over the PMOS device; and
   forming a third stressed layer over the semiconductor substrate and over and adjoining the first stressed layer or the second stressed layer.

5. The method of claim 4, wherein the forming the first source/drain electrode and the forming the second source/drain electrode each comprises selective electroless plating or silicidation.

6. The method of claim 4, wherein the forming the PMOS device and the NMOS device comprises implanting impurities into the semiconductor substrate to form the first source/drain region and the second source/drain region, wherein the impurities implanted to form the first source/drain region comprise a native lattice constant greater than silicon, and wherein the impurities implanted to form the second source/drain region comprise a native lattice constant smaller than silicon.

* * * * *